United States Patent Office 3,809,588

Patented May 7, 1974

3,809,588
PEROXY CONTAINING COMPOSITIONS

Rudolf J. Zeblisky, 41 Glenwood Drive, Hauppauge, N.Y. 11787

No Drawing. Continuation-in-part of abandoned application Ser. No. 873,636, Nov. 3, 1969. This application Oct. 8, 1971, Ser. No. 187,916
Int. Cl. C23f *1/00*
U.S. Cl. 156—18 35 Claims

ABSTRACT OF THE DISCLOSURE

Etching solutions containing a peroxy-containing compound, a complexing agent for copper and an etchant stabilizing agent useful in the etching of copper.

This application is a continuation-in-part of U.S. patent application Ser. No. 873,636, filed Nov. 3, 1969, now abandoned.

Background of the invention.—Several methods have been developed for selectively dissolving or etching copper in the production of electrical printed circuits, printing plates or other products having predetermined raised portions, or reliefs, of copper metal. In the production of printed circuits, for example, copper foil is laminated to a plastic sheet or to a fiber sheet impregnated with a bonding material such as a phenolic resin, and is masked with a resist material to establish pattern areas which later become the circuit. The resist material may be an organic etch resist such as resin or wax or it may be a metal resist such as a solder (tin-lead), gold, nickel, silver, etc. Regardless of the etch resist, the desired characteristic of any etchant is that it dissolves the exposed metal, e.g., copper only without affecting the etch resist.

To date, no etchant is available which may be called "universal" for printed circuits. While there are several which are effective in etching copper without affecting certain etch resists, there is not available at this time an etchant which can generally be used with any and all etch resists, regardless of their nature. For example, ferric chloride is basically used for print and etch type circuits using an organic etch resist. This etchant however, attacks nickel and solder. Another etchant, cupric chloride possesses the same drawbacks as ferric chloride. Chromic acid attacks silver. Another commonly used etchant, ammonium peroxydisulfate attacks solder, causes a very severe undercut problem when silver or nickel-gold are used as etch resists resulting from the setting up of a galvanic cell between the copper and silver or copper and nickel-gold.

In contrast to the prior art, the etchant of this invention is "universal" in that it is unreactive toward both organic and metal etch resists. This etchant has many significant advantages over previously used etchants. It is primarily effective in etching copper in the manufacture of printed circuits, regardless of the etch resist employed. Furthermore, it is economical, non-toxic and easily disposed of.

The stabilized composition disclosed herein may also find application in other industrial processes. For instance, the subject stabilized compositions may be employed in the textile, paper and other related industries as bleaching agents where stabilized oxidizing compositions are necessary.

Summary of the invention.—This invention in one embodiment is concerned with novel etching solutions capable of etching copper bearing a resist pattern without deleteriously affecting the etch resist regardless of whether the resist is organic or metallic in character. More particularly, this invention relates to etching solutions comprising a solvent preferably water, a peroxy-containing compound, a complexing agent for copper and an etchant stabilizing agent.

The range for the components of this etching solution is about 0.1% by weight to saturation of peroxy-containing compound, an amount of complexing agent sufficient to complex the oxidized copper and at least about 0.01% to about 75% by weight of etchant stabilizing agent. Although the preferred range of peroxy-containing compound is from about 1% to about 25% by weight, in certain cases concentrations of 0.1% or lower may be employed.

A particularly preferred embodiment of this invention includes an etching solution wherein the peroxy-containing compound is a peroxydisulfate such as ammonium peroxydisulfate and the complexing agent for copper is ammonium hydroxide. Specific examples of this latter embodiment encompass solutions where the following stabilizing agents are utilized: tetrasodium ethylenediamine tetraacetic acid, tetraethylenepentamine, glycolic acid, 1,3-butanediol, methanol, 1-butanol, isopropyl alcohol, diacetone alcohol and glycol monoacetate.

In addition, this invention also contemplates within its scope the situation where the complexing agent and the stabilizing agent are the same. A typical example of such situation is ethylenediamine which can function as both a stabilizer and complexer.

When the compositions of the invention are employed as bleaching agents, the complexing agent for the copper may be omitted. However, in such compositions it is sometimes advantageous to employ hydroxide, which is a complexer, as an agent for pH control.

In accordance with another embodiment of this invention, there is provided a method for etching copper bearing a patterned resist to provide an etched copper product using the above-described etching solutions. The method disclosed herein is particularly advantageous since it can be used for etching copper in the production of electrical printed circuits in which the etch resist can be an organic material or certain metals or metallic alloys which are well known to those skilled in the art. The metals include tin, lead, nickel, silver, palladium, platinum, gold, ruthenium, cobalt, etc. More specifically, the etching solutions disclosed herein have the following advantages:

(a) They have accelerated etching rates
(b) The etch resists will be clean and free of reaction products on completion of the etch
(c) They prevent or virtually reduce undercutting
(d) They have increased etching capacity and life
(e) They are economical
(f) They remain uniform with regard to etching rates throughout their duration Detailed description of the invention.—A typical form of copper which is etched in accordance with our invention is copper foil about 0.0014 to about 0.0070 inch in thickness, carried on a backing material such as a resin-bonded fiber sheet or other backing material. A typical etched copper printed circuit is prepared from a copper foil 0.0014 inch thick employing a tin-lead solder resist pattern. Of course, the etch resist can be other metals, for example, nickel, gold, silver, etc., as well as metal alloys.

The etch is generally carried out in a spray etcher wherein a uniform spray distribution of the test aqueous etching solution is effected by utilizing oscillating spray nozzles. Following etching, the specimens are removed from the etching bath, rinsed with distilled water and observed.

The aqueous etching solutions of this invention are characterized by a solution of pH of more than 7 and less than 13 and containing three essential components, namely a peroxy-containing compound, a complexing agent for copper and a stabilizing agent. Although it has been previously known to carry out etching reactions under acidic conditions, it has been discovered that best results for the etching solutions disclosed herein are obtained if the solution pH is above 7. A preferred pH is a pH range from 8 to 13 and even more particularly preferred is one between 9 and 10. It has been found that the maintenance of the desired pH range prevents a tendency to attack metal resists. Further, it also prevents a galvanic cell from forming between the metal resist and the copper to be etched. Still further, it reduces undercutting due to reduction of galvanic action.

In many instances, the pH of the bath solution results from the basicity of the particular components of the solution and there is no need to add anything further to adjust the pH level. However in some cases, as when ammonium hydroxide is used as the complexing agent, it is advantageous to utilize a buffering agent to maintain the pH at the desired level.

Often at times, the buffering agent improves the etching rate as well as the etching capacity of the etching solution. Buffering agents which have been found to be particularly useful include: ammonium bicarbonate, ammonium acetate, ammonium iodide, ammonium chloride, ammonium bromide, ammonium phosphate, sodium bicarbonate, potassium acetate, sodium carbonate, and urea.

As for the complexing agent component of this invention, it has been found that any material capable of complexing or chelating with copper is suitable for purposes of this invention. This is based on the requirement that the complexing agent must be able to solubilize the etched copper at a solution pH greater than 7. A highly preferred complexing agent is ammonium hydroxide for the simple reason that it is quite inexpensive. However, from the standpoint of comparative functionality, other material will work as well. Such other complexing agents which can be used to practice this invention include: primary, secondary and tertiary organo amines, hydroxy-substituted primary, secondary and tertiary organoamines, and ethylenediamine tetraacetic acid and its alkali metal salts. Of course, it should be understood that there are many other complexing agents which find application in this invention and the only limitation is that they are capable of complexing with copper.

The second component in the etching solutions of this invention is referred to as a peroxy-containing compound.

Representative types of peroxy-containing compounds are ammonium, alkali metal and alkaline earth metal peroxy-disulfates and peroxy-monosulfates, and organoperoxy acids and their salts.

Specific examples include ammonium peroxydisulfate, disodium peroxymonosulfate, peroxyacetic acid and peroxybenzoic acid. Since the stabilizing agent action is believed to prevent or inhibit the hydrolysis of the peroxy-containing compound to an unstable peroxide, it is understandable that the peroxy-containing compound as contemplated by this invention does not include hydrogen peroxide or compounds of the formula $M_2O_2$ where M is a monopositive cation.

The third and most important component of the presently disclosed etching solutions is the stabilizing agent. Without it, the etching solution would be almost totally ineffective. Despite its relative importance, it is quite surprising to find that only relatively small amounts of stabilizing agent are required to provide the unexpected benefits of the etching bath solutions disclosed herein. Most stabilizers are effective at a concentration as low as 0.1% by weight. However, there will be instances where greater concentrations are more preferred. The ultimate concentration which one uses is critical only to the extent that it is sufficient to prevent spontaneous decomposition of the etchant. Of course, there is no disadvantage in utilizing greater concentrations and it may be beneficial to do so. It is obvious that using amounts in excess will only warrant consideration from the standpoint of economy.

In addition to stabilizing the resulting aqueous bath solutions, they also act as accelerators in the overall etching process.

The materials which are found to provide the stabilizing and accelerating qualities needed for effective etching solutions of this invention fall into several general groups. These comprise (a) mono- and polyorganoamines, (b) carboxy-substituted mono- and polyorganoamines and metal salts thereof, (c) hydroxy- substituted mono- and polyorganoamines, (d) mono- and polyorganoamino-ethers, (e) urea and mono- and lower dialkyl substituted ureas, (f) hydroxy carboxylic acids, (g) monohydroxy alcohols preferably containing 1 to 4 carbon atoms, (h) dihydroxy alcohols, (i) monoacylated dihydroxy alcohols, (j) keto alcohols and (k) aliphatic ketones and ethers preferably containing from 3 to 6 carbon atoms.

Specific illustrations of class (a) are n-butyl-amine, ethylenediamine, diethylene triamine and tetraethylenepentamine; of class (b) are ethylenediamine tetraacetic acid and ethylenediamine tetraacetic acid tetra sodium salt; of class (c) are ethanolamine, triethanolamine; trisodium hydroxyethyl ethylenediamine tetraacetic acid and tetrakis (2-hydroxypropyl) ethylenediamine; of class (d) are diaminoethyl ether tetraacetic acid and ethylene glycol bis-[aminoethylether] tetraacetic acid; of class (e) are urea, N-methyl urea, N-diethylurea, N,N′-methyl urea and N,N′-dibutyl urea; of class (f) are glycolic acid, lactic acid and tartaric acid; of class (g) are methanol, ethanol, isopropanol and 1-butanol; of class (h) are ethylene glycol, propylene glycol and 1,3-butanediol; of class (i) are ethylene glycol monoacetate, ethylene glycol monobutylate and propyleneglycol monopropionate; of class (j) is diacetone alcohol; of class (k) are acetone, butanone-2, diethyl ether and dibutyl ether.

Those skilled in the art will appreciate that at least 0.5 mole of peroxy-containing compound should be employed per mole of metallic copper to oxidize the copper. It is believed that $Cu^+$ ions are first obtained in the oxidation of $Cu^\circ$ prior to the formation of $Cu^{++}$ ions but the operability of the process does not depend on the formation of any particular product or intermediate. Usually, it is of course preferred to utilize a greater amount as the peroxy compound is consumed during the oxidation process and unless a sufficient amount is employed, the reaction will terminate. The following compositions are illustrative of operable compositions but are not intended to limit the broad scope of the invention which includes the stabilization of compositions of peroxy containing compounds which contain amounts of such peroxy containing compounds sufficient to oxidize metallic copper substrates.

The quantities of the various ingredients in the etching solution are subject to wide variation within certain ranges which may be defined as follows:

| | |
|---|---|
| (a) Peroxy-containing agent | 0.1% to saturation. |
| (b) Complexing agent | At least an amount sufficient to complex the oxidized copper. |
| (c) Stabilizing agent | At least 0.01% by weight to 75%. |

The complexing agent is present in an amount sufficient to complex the oxidized copper and maintain it in solution. Usually at least an equimolar amount of complexer, based on the peroxy containing agent is added although it is preferred to add an excess of complexers.

The method of etching copper according to this invention is carried out at temperatures of between 0° C. and 100° C. However, it is most preferred to utilize a temperature of about 25° C. to about 50° C.

Although water is preferred as solvent, it is possible and even desirable in certain instances to use non-aqueous systems. Such systems are within the purview of this invention. For example, when the stabilizing agent is an alcohol or ether, it may also serve as a solvent by simply utilizing a greater amount.

The following examples are given solely for the purpose of illustration and are not to be construed as limitations of this invention, many variations of which are possible without departing from the spirit or scope thereof.

EXAMPLE I

A one-liter aqueous solution was prepared containing the following ingredients:

| | | |
|---|---|---|
| (a) Ammonium peroxydisulfate | g | 240.0 |
| (b) Ammonium hydroxide (29% $NH_3$) | ml | 350 |
| (c) Ammonium chloride (buffering agent) | g | 30.0 |
| (d) Methanol | ml | 5 |

Additional ammonium hydroxide solution is then added to maintain a pH of about 9.75.

EXAMPLE II

The procedure of Example I is repeated wherein the amount of ammonium hydroxide added is sufficient to prepare solutions having the following pH levels:

pH: 7.0, 8.0, 10.0, 13.0

EXAMPLE III

The procedure of Example I is repeated wherein the following buffering agents are used in lieu of ammonium chloride with comparable results: ammonium bicarbonate, ammonium acetate, ammonium bromide, ammonium iodide, ammonium phosphate, sodium bicarbonate, potassium acetate, sodium carbonate and potassium carbonate.

EXAMPLE IV

The procedure of Example I is repeated wherein the following peroxy compounds in stoichiometric equivalent amounts are used in lieu of ammonium peroxydisulfate with comparable results: sodium peroxydisulfate, lithium peroxydisulfate, barium peroxydisulfate, strontium peroxydisulfate, potassium peroxydisulfate, disodium peroxymonosulfate, peroxyacetic acid, peroxytrifluoroacetic acid and peroxybenzoic acid.

EXAMPLE V

The procedure of Example I is repeated wherein the following complexing agents in stoichiometric equivalent amounts are used in lieu of ammonium hydroxide with comparable results:

| | |
|---|---|
| n-Butylamine | Triethanolamine. |
| Di-butylamine | Ethylenediamine tetraacetic acid. |
| Tert-butylamine | Diethanolamine. |
| Ethanolamine | Tetrasodium ethylenediamine tetraacetic acid. |

EXAMPLE VI

The procedure of Example I is repeated wherein a stoichiometric equivalent amount of tetraethylenepentamine is used in lieu of methanol with comparable results.

EXAMPLE VII

The procedure of Example I is repeated wherein a stoichiometric equivalent amount of ethylenediamine tetraacetic acid is used in lieu of methanol with comparable results.

EXAMPLE VIII

The procedure of Example I is repeated wherein a stoichiometric equivalent amount of N,N,N′,N′-tetrakis (2-hydroxypropyl) is used in lieu of methanol with comparable results.

EXAMPLE IX

The procedure of Example I is repeated wherein a stoichiometric equivalent amount of trisodium hydroxyethyl ethylenediamine triacetate is used in lieu of methanol with comparable results.

EXAMPLE X

The procedure of Example I is repeated wherein a stoichiometric equivalent amount of ethylenediamine is used in lieu of methanol with comparable results.

EXAMPLE XI

The procedure of Example I is repeated wherein a stoichiometric equivalent amount of glycolic acid is used in lieu of methanol with comparable results.

EXAMPLE XII

The procedure of Example I is repeated wherein a stoichiometric equivalent amount of 1,3-butanediol is used in lieu of methanol with comparable results.

EXAMPLE XIII

The procedure of Example I is repeated wherein a stoichiometric equivalent amount of diacetone alcohol is used in lieu of methanol with comparable results.

EXAMPLE XIV

The procedure of Example I is repeated wherein stoichiometric equivalent amounts of the following stabilizing agents are used in place of methanol with comparable results: triethanolamine, tartaric acid, lactic acid, urea, ethanol, isopropanol, n-butanol, acetone, butanone-2, diethylether, dibutylether, ethylene glycol monoacetate, ethylene glycol monobutyrate, propylene glycol propionate.

EXAMPLE XV

The procedure of Example I is repeated wherein the same ingredients (a), (b), and (c) are used except in the following proportions:

| | | |
|---|---|---|
| (a) Ammonium peroxydisulfate | g | 25 |
| (b) Ammonium hydroxide (29% $NH_3$) | ml | 100 |
| (c) Ammonium chloride (buffering agent) | g | 10 |
| (d) Methanol | ml | 5 |

Equivalent results are obtained.

EXAMPLE XVI

A one-liter aqueous solution is prepared containing the following ingredients:

| | | |
|---|---|---|
| (a) Ammonium peroxydisulfate | g | 170.0 |
| (b) Ethylenediamine | ml | 100 |

Sufficient ammonium bicarbonate (120 g.) is then added to obtain a pH level of 9.45 for the resulting etching solution.

EXAMPLE XVII

The procedure of Example I is repeated wherein the following materials are used as stabilizing agent and as solvent substitute for water: methanol, ethanol, diethyl ether.

EXAMPLE XVIII

The above-described etching solutions were tested in a spray etcher wherein the time required to etch a copper strip 0.0014 inch thick was measured at various temperatures. Boards having nickel, gold, and solder-plated circuit patterns were tested with the spray solutions under the same conditions in order to determine the effect of the instant etching solutions upon them.

| Etching solution of— | Time to etch copper, minutes | Temperature, ° C. |
|---|---|---|
| Example: | | |
| I | 1.5–3 | 30 |
| VI | 2 | 40 |
| VII | 2.75–3 | 40 |
| VIII | 3 | 40 |
| IX | 2 | 40 |
| X | 1.7 | 40 |
| XI | 1.75 | 40 |
| XII | 2 | 40 |
| XIII | 2.5 | 40 |
| XVI | 5 | 40 |
| Control (Example I without stabilizing agent) | 7–10 | 40 |

In all instances, the nickel-, gold- and solder-plated circuit patterns were unaffected. There were no evidence of galvanic etching or undercutting of the circuit patterns.

The unstabilized control however decomposed spontaneously shortly after make-up and consumed almost all the etching power.

These results clearly indicate the advantages of the presently disclosed etching solutions.

EXAMPLE XIX

The test procedure outlined in Example XVIII is repeated in order to test the etch solutions described in Examples II, III, IV, V, XIV, XV and XVIII. Corresponding good results are obtained in each case.

EXAMPLE XX

A one-liter aqueous textile bleaching composition is prepared as follows:

| | |
|---|---|
| (a) Ammonium peroxydisulfate ____g__ | 50.0 |
| (b) Methanol ____ml__ | 5.0 |

The pH of the solution was adjusted to 8.5 by the addition of aqueous sodium hydroxide.

EXAMPLE XXI

A one-liter aqueous composition is prepared as follows:

| | |
|---|---|
| (a) Sodium peroxydisulfate ____g__ | 8.0 |
| (b) Ethanol ____ml__ | 2.5 |

The pH of the solution was adjusted to 9.0 by the addition of ammonia.

EXAMPLE XXII

A one-liter aqueous composition is prepared as follows:

| | |
|---|---|
| (a) Ammonium peroxydisulfate ____g__ | 25.0 |
| (b) Ammonium chloride ____g__ | 10.0 |
| (c) Ethanol ____ml__ | 5.0 |

The pH of the solution was adjusted to 8.5 with a solution of concentrated ammonium hydroxide.

EXAMPLE XXIII

A one-liter aqueous solution was prepared as follows:

| | |
|---|---|
| (a) Ammonium peroxydisulfate ____g__ | 100.0 |
| (b) Methanol ____ml__ | 10.0 |

The pH is adjusted to 8.5 by metering into the solution ammonia gas.

EXAMPLE XXIV

A one-liter composition is prepared as follows:

| | |
|---|---|
| (a) Ammonium peroxydisulfate ____g__ | 100 |
| (b) Methanol ____ml__ | 700.0 |
| Water, q.s. ____ml__ | 1000.0 |

The pH of the solution was adjusted to 9.0 with a solution of concentrated ammonium hydroxide.

EXAMPLE XXV

A one-liter composition is prepared as follows:

| | |
|---|---|
| (a) Ammonium peroxydisulfate ____g__ | 50.0 |
| (b) Ethanol ____ml__ | 600.0 |
| Water, q.s. ____ml__ | 1000.0 |

The pH of the solution was adjusted to 8.5 with a solution of concentrated ammonium hydroxide.

What is claimed is:

1. A stabilized composition comprising an amount of a peroxy-containing compound selected from the group consisting of ammonium, alkali metal and alkaline earth metal peroxydisulfates and peroxymonosulfates, and organoperoxy acids and their salts sufficient to oxidize metallic copper, an amount of complexing agent selected from the group consisting of ammonium hydroxide, primary, secondary and tertiary organoamines, hydroxy-substituted primary, secondary and tertiary organoamines and ethylenediamine tetraacetic acid and its alkali metal salts sufficient to complex the oxidized copper and at least from about 0.01% to about 75% by weight of an etchant stabilizing agent selected from the group consisting of mono- and polyorganoamines, carboxy-substituted mono- and polyorganoamines and metal salts thereof, hydroxy-substituted mono- and polyorganoamino-ethers, urea and mono- and dialkyl-substituted ureas, hydroxy carboxylic acids, mono- hydroxy alcohols, dihydroxy alcohols, mono-acylated dihydroxy alcohols, keto alcohols and aliphatic ketones and ethers and a solvent therefor, the resulting composition having a pH above 7.

2. The composition of claim 1 wherein from about 0.1% by weight to saturation of a peroxy-containing compound is employed.

3. The composition of claim 1 wherein said solvent is water.

4. The composition of claim 1 wherein said complexing agent and said stabilizing agent are the same.

5. An aqueous bath for etching copper having a pH between about 8 and 13 maintained by a buffering agent comprising water, from about 0.1% by weight to saturation of ammonium peroxydisulfate, an amount of ammonium hydroxide sufficient to complex the oxidized copper and at least from about 0.01% to about 75% by weight of an etchant stabilizing agent.

6. The composition of claim 5 wherein said buffering agent is selected from the group consisting of ammonium chloride, and ammonium bicarbonate.

7. The composition of claim 5 wherein said stabilizing agent is ethylenediamine tetracetic acid.

8. The composition of claim 5 wherein said stabilizing agent is trisoduim hydroxyethyl ethylenediamine triacetic acid.

9. The composition of claim 5 wherein said stabilizing agent is N,N,N',N'-tetrakis (2-hydroxypropyl) ethylenediamine.

10. The composition of claim 5 wherein said stabilizing agent is tetraethylenepentamine.

11. The composition of claim 5 wherein said stabilizing agent is glycolic acid.

12. The composition of claim 5 wherein said stabilizing agent is 1,3-butanediol.

13. The composition of claim 5 wherein said stabilizing agent is methanol.

14. A composition comprising from about 0.01% by weight to saturation of a peroxy-containing compound selected from the group consisting of ammonium, alkali metal and alkaline earth metal peroxy-disulfates and organoperoxy acids and their salts, and at least from about 0.01% to about 75% by weight of a stabilizing agent for said compound and a solvent therefor, the resulting composition having a pH between 8 and 13.

15. An aqueous bath for etching having a pH between about 8 and 13 maintained by a buffering agent comprising water, from about 0.01% by weight to saturation of ammonium peroxydisulfate, and at least from about 0.01% to about 75% by weight of an etchant stabilizing agent.

16. A composition as defined in claim 14 which comprises from about 0.1% by weight to saturation of a peroxy-containing compound selected from the group consisting of ammonium, alkali metal and alkaline earth metal peroxy-disulfates and organoperoxy acids and their salts and at least from about 0.01% to about 75% by weight of a stabilizing agent for said compound selected from the group consisting of mono- and polyorganoamines, carboxy-substituted mono- and polyorganoamines and metal salts thereof, hydroxy-substituted mono- and polyorganoamines, mono- and polyorganoamino ethers, urea and mono- and dialkyl substituted ureas, hydroxy carboxylic acids, monohydroxy alcohols, dihydroxy alcohols, monoacylated dihydroxy alcohols, keto alcohols and aliphatic ketones and ethers and a solvent therefor, the resulting composition having a pH between 8 and 13.

17. In the process for the etching of copper metal which employs a solution of a peroxy-containing compound selected from the group consisting of ammonium, alkali metal and alkaline earth metal peroxydisulfates and peroxy-monosulfates and organoperoxy acids and their salts and a complexing agent, the improvement which comprises employing from 0.01% to about 75% by weight of an etchant stabilizing agent selected from the group consisting of mono- and polyorganoamines, carboxy-substituted mono- and polyorganoamines and metal salts thereof, hydroxy-substituted mono- and polyorganoaminoethers, urea and mono- and dialkyl-substituted ureas, hydroxy carboxylic acids, monohydroxy alcohols, dihydroxy alcohols and aliphatic ketones and ethers at a pH above 7.

18. The process of claim 17 wherein at least 0.5 mole of peroxy containing compound is employed per mole of copper to be etched.

19. The process of claim 17 wherein methanol is employed as the stabilizer.

20. A process for the etching of copper metal which comprises contacting metallic copper with a composition which comprises a peroxy-containing compound selected from the group consisting of ammonium, alkali metal, and alkaline earth peroxydisulfates and peroxymonosulfates and organoperoxyacids and their salts, in an amount sufficient to oxidize metallic copper, an amount of a complexing agent selected from the group consisting of ammonium hydroxide, primary, secondary and tertiary organoamines and ethylenediamine tetraacetic acid and its alkali metal salts sufficient to complex the oxidized copper and at least from about 0.01% to about 75% by weight of an etchant stabilizing agent selected from the group consisting of mono- and polyorganoamines, carboxy-substituted mono- and polyorganoamines and metal salts thereof, hydroxy-substituted mono- and polyorganoaminoethers, urea and mono- and dialkyl-substituted ureas, hydroxy carboxylic acids, monohydroxy alcohols, dihydroxy alcohols, mono-acylated dihydroxy alcohols, keto alcohols and aliphatic ketones and ethers and a solvent therefor, the resulting composition having a pH above 7.

21. The process of claim 19 wherein the peroxy-containing compound is ammonium persulfate.

22. The process of claim 19 wherein methanol is employed as the stabilizer.

23. A composition comprising from about 1% by weight to saturation of a peroxy-containing compound selected from the group consisting of ammonium, alkali metal and alkaline earth metal peroxydisulfates and peroxy-monosulfates, and organoperoxy acids and their salts, an amount of complexing agent selected from the group consisting of ammonium hydroxide, primary, secondary and tertiary organo amines, hydroxy-substituted primary, secondary and tertiary organo amines and ethylenediamine tetraacetic acid and its alkali metal salts sufficient to complex the oxidized copper and at least from about 0.1% to about 9% by weight of an etchant stabilizing agent selected from the group consisting of mono- and polyorganoamines, carboxy-substituted mono- and polyorganomaines and metal salts thereof, hydroxy-substituted mono- and polyorganomaines, mono- and polyorganoaminoethers, urea and mono- and dialkyl substituted ureas, hydroxy carboxylic acids, monohydroxy alcohols, dihydroxy alcohols, monoacylated dihydroxy alcohols, keto alcohols and aliphatic ketones and ethers and a solvent therefor, the resulting composition having a pH between 8 and 13.

24. The composition of claim 23 wherein said solvent is water.

25. The composition of claim 23 wherein said complexing agent and said stabilizing agent are the same.

26. An aqueous bath for etching copper having a pH between about 8 and 13 maintained by a buffering agent comprising water, from about 1% by weight to saturation of ammonium peroxydisulfate, an amount of ammonium hydroxide sufficient to complex the oxidized copper and at least 0.1% by weight of an etchant stabilizing agent.

27. The composition of claim 26 wherein said buffering agent is ammonium chloride.

28. The composition of claim 26 wherein said stabilizing agent is ethylenediamine tetraacetic acid.

29. The composition of claim 26 wherein said stabilizing agent is trisodium hydroxyethyl ethylenediamine triacetic acid.

30. The composition of claim 26 wherein said stabilizing agent is N,N,N',N'-tetrakis (2-hydroxypropyl) ethylenediamine.

31. The composition of claim 26 wherein said stabilizing agent is tetraethylenepentamine.

32. The composition of claim 26 wherein said stabilizing agent is glycolic acid.

33. The composition of claim 26 wherein said stabilizing agent is 1,3-butanediol.

34. The composition of claim 26 wherein said stabalizing agent is methanol.

35. A composition which comprises from about 1% by weight to saturation of a peroxy-containing compound selected from the group consisting of ammonium, alkali metal and alkaline earth metal peroxydisulfates and organoperoxy acids and their salts and at least from about 0.1% to about 9% by weight of a stabilizing agent for said compound selected from the group consisting of mono- and polyorganoamines, carboxy-substituted mono- and polyorganoamines and metal salts thereof, hydroxy-substituted mono- and polyorganomaines, mono- and polyorganoaminoethers, urea and mono- and dialkyl substituted ureas, hydroxy carboxylic acids, monohydroxy alcohols, dihydroxy alcohols, monoacylated dihydroxy alcohols, keto alcohols and aliphatic ketones and ethers and a solvent therefor, the resulting composition having a pH between 8 and 13.

References Cited

UNITED STATES PATENTS

| | | | |
|---|---|---|---|
| 2,982,625 | 5/1961 | Saubestre | 252—79.2 |
| 3,063,944 | 11/1962 | Zussman et al. | 252—79.1 |
| 3,410,802 | 11/1968 | Radimer et al. | 252—79.1 |
| 3,458,446 | 7/1969 | Diaz | 252—99 |
| 3,463,733 | 8/1969 | Achenbach | 252—79.4 |
| 3,476,624 | 11/1969 | Hogya et al. | 156—13 |
| 3,556,711 | 1/1971 | Stalter | 252—186 |

WILLIAM A. POWELL, Primary Examiner

U.S. Cl. X.R.

8—111; 156—3, 8; 252—79.5